(12) United States Patent
Rebak et al.

(10) Patent No.: US 8,528,208 B2
(45) Date of Patent: Sep. 10, 2013

(54) METHODS OF FABRICATING A COATED COMPONENT USING MULTIPLE TYPES OF FILLERS

(75) Inventors: Raul Basilio Rebak, Schenectady, NY (US); Ronald Scott Bunker, Waterford, NY (US); Lawrence Bernard Kool, Clifton Park, NY (US); Don Mark Lipkin, Niskayuna, NY (US); John Brian McDermott, Rexford, NY (US); Ann Melinda Ritter, Niskayuna, NY (US); Renee Bushey Rohling, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 171 days.

(21) Appl. No.: 13/083,701

(22) Filed: Apr. 11, 2011

(65) Prior Publication Data

US 2012/0255870 A1 Oct. 11, 2012

(51) Int. Cl.
*B21D 53/78* (2006.01)
*B05D 5/00* (2006.01)
*B26D 3/06* (2006.01)

(52) U.S. Cl.
USPC .................. 29/889.72; 29/889.721; 427/290; 83/875

(58) Field of Classification Search
None
See application file for complete search history.

(56) References Cited

U.S. PATENT DOCUMENTS

| | | | |
|---|---|---|---|
| 4,545,427 A * | 10/1985 | Alario et al. | 165/104.26 |
| 5,075,966 A * | 12/1991 | Mantkowski | 29/890.01 |
| 5,626,462 A | 5/1997 | Jackson et al. | |
| 5,640,767 A | 6/1997 | Jackson et al. | |
| 5,875,549 A | 3/1999 | McKinley | |
| 6,214,248 B1 | 4/2001 | Browning et al. | |
| 6,234,755 B1 | 5/2001 | Bunker et al. | |
| 6,321,449 B2 | 11/2001 | Zhao et al. | |
| 6,368,060 B1 | 4/2002 | Fehrenbach et al. | |
| 6,412,541 B2 | 7/2002 | Roesler et al. | |
| 6,427,327 B1 * | 8/2002 | Bunker | 29/889.1 |
| 6,551,061 B2 | 4/2003 | Darolia et al. | |
| 6,582,194 B1 * | 6/2003 | Birkner et al. | 416/97 R |
| 6,602,053 B2 | 8/2003 | Subramanian et al. | |
| 6,617,003 B1 | 9/2003 | Lee et al. | |

(Continued)

FOREIGN PATENT DOCUMENTS

EP 1387040 B1 4/2004

OTHER PUBLICATIONS

D.G. Hyams et al., "A Detailed Analysis of film Cooling Physics: Part III—Streamwise Injection With Shaped Holes," Journal of Turbomachinery, vol. 122, Issue 1, Jan. 2000, pp. 122-132.

(Continued)

*Primary Examiner* — Timothy Meeks
*Assistant Examiner* — Ina Agaj
(74) *Attorney, Agent, or Firm* — Penny A. Clarke (57) ABSTRACT

Methods of fabricating coated components using multiple types of fillers are provided. One method comprises forming one or more grooves in an outer surface of a substrate. Each groove has a base and extends at least partially along the outer surface. A sacrificial filler is deposited within the groove, a second filler is deposited over the sacrificial filler, and a coating is disposed over at least a portion of the outer surface and over the second filler. The method further includes removing the sacrificial filler and at least partially removing the second filler from the groove(s), to define one or more channels for cooling the component.

22 Claims, 7 Drawing Sheets

(56) References Cited

U.S. PATENT DOCUMENTS

| | | |
|---|---|---|
| 6,905,302 B2 | 6/2005 | Lee et al. |
| 6,921,014 B2 | 7/2005 | Hasz et al. |
| 7,014,923 B2 | 3/2006 | Schnell et al. |
| 7,094,475 B2 | 8/2006 | Schnell et al. |
| 7,186,167 B2 | 3/2007 | Joslin |
| 7,302,990 B2 | 12/2007 | Bunker et al. |
| 7,744,348 B2 | 6/2010 | Bezencon et al. |
| 2006/0266285 A1* | 11/2006 | Fernihough et al. .......... 118/504 |
| 2010/0080688 A1 | 4/2010 | Bezencon et al. |

OTHER PUBLICATIONS

B. Wei et al., "Curved Electrode and Electrochemical Machining Method and Assembly Employing the Same," U.S. Appl. No. 12/562,528, filed Sep. 18, 2009.

W. Zhang et al., Process and System for Forming Shaped Air Holes, U.S. Appl. No. 12/697,005, filed Jan. 29, 2010.

B.P. Lacy et al., "Hot Gas Path Component Cooling System," U.S. Appl. No. 12/765,372, filed Apr. 22, 2010.

B. Lacy et a., "Articles Which Include Chevron Film Cooling Holes, and Related Processes," U.S. Appl. No. 12/790,675, filed May 28, 2010.

J.E.J. Lambie et al., "An overview on micro-meso manufacturing techniques for micro-eat exchangers for turbine blade cooling," International Journal Manufacturing Research, vol. 3, No. 1, 2008, pp. 3-26.

R.S. Bunker et al., "Components With Re-Entrant Shaped Cooling Channels and Methods of Manufacture," U.S. Appl. No. 12/943,624, filed Nov. 10, 2010.

R.S. Bunker et al., "Component and Methods of Fabricating and Coating a Component," U.S. Appl. No. 12/943,646, filed Nov. 10, 2010.

R.S.Bunker et al., "Method of Fabricating a Component Using a Fugitive Coating," U.S. Appl. No. 12/943,563, filed Nov. 10, 2010.

R.S. Bunker et al., "Components With Cooling Channels and Methods of Manufacture," U.S. Appl. No. 12/965,083, filed Dec. 10, 2010.

R. S. Bunker et al., "Method of Fabricating a Component Using a Two-Layer Structural Coating," U.S. Appl. No. 12/996,101, filed Dec. 13, 2010.

R.S. Bunker et al., "Turbine Components With Cooling Features and Methods of Manufacturing the Same," U.S. Appl. No. 12/953,177, filed Nov. 23, 2010.

R.S. Bunker, "Components With Cooling Channels and Methods of Manufacture," U.S. Appl. No. 13/026,595, filed Feb. 14, 2011.

* cited by examiner

METHODS OF FABRICATING A COATED COMPONENT USING MULTIPLE TYPES OF FILLERS

BACKGROUND

The invention relates generally to gas turbine engines, and, more specifically, to micro-channel cooling therein.

In a gas turbine engine, air is pressurized in a compressor and mixed with fuel in a combustor for generating hot combustion gases. Energy is extracted from the gases in a high pressure turbine (HPT), which powers the compressor, and in a low pressure turbine (LPT), which powers a fan in a turbofan aircraft engine application, or powers an external shaft for marine and industrial applications.

Engine efficiency increases with temperature of combustion gases. However, the combustion gases heat the various components along their flowpath, which in turn requires cooling thereof to achieve a long engine lifetime. Typically, the hot gas path components are cooled by bleeding air from the compressor. This cooling process reduces engine efficiency, as the bled air is not used in the combustion process.

Gas turbine engine cooling art is mature and includes numerous patents for various aspects of cooling circuits and features in the various hot gas path components. For example, the combustor includes radially outer and inner liners, which require cooling during operation. Turbine nozzles include hollow vanes supported between outer and inner bands, which also require cooling. Turbine rotor blades are hollow and typically include cooling circuits therein, with the blades being surrounded by turbine shrouds, which also require cooling. The hot combustion gases are discharged through an exhaust which may also be lined, and suitably cooled.

In all of these exemplary gas turbine engine components, thin metal walls of high strength superalloy metals are typically used for enhanced durability while minimizing the need for cooling thereof. Various cooling circuits and features are tailored for these individual components in their corresponding environments in the engine. For example, a series of internal cooling passages, or serpentines, may be formed in a hot gas path component. A cooling fluid may be provided to the serpentines from a plenum, and the cooling fluid may flow through the passages, cooling the hot gas path component substrate and coatings. However, this cooling strategy typically results in comparatively low heat transfer rates and non-uniform component temperature profiles.

Micro-channel cooling has the potential to significantly reduce cooling requirements by placing the cooling as close as possible to the heated region, thus reducing the temperature difference between the hot side and cold side of the main load bearing substrate material for a given heat transfer rate. Currently, a single sacrificial material is used to keep the structural coating from plugging the cooling channels during its application. Because cooling channels tend to have large ratios of length to hydraulic diameter, the filler removal process is typically time-consuming and hence expensive and further can be subject to incomplete removal of the filler.

It would therefore be desirable to provide methods for depositing a structural coating over cooling channels that overcome the above-noted shortcomings of current techniques.

BRIEF DESCRIPTION

One aspect of the present invention resides in a method of fabricating a component, the method comprising forming one or more grooves in an outer surface of a substrate. Each groove has a base and extends at least partially along the surface of the substrate. The fabrication method further includes depositing a sacrificial filler within the groove(s), depositing a second filler over the sacrificial filler, and disposing a coating over at least a portion of the outer surface of the substrate and over the second filler. The fabrication method further includes removing the sacrificial filler and at least partially removing the second filler from the groove(s), to define one or more channels for cooling the component.

Yet another aspect of the present invention resides in a method of fabricating a component, the method comprising: forming one or more grooves in an outer surface of a substrate. Each groove has a base that is wider than a top thereof and extends at least partially along the outer surface of the substrate, such that each groove comprises a re-entrant shaped groove. The fabrication method further includes depositing a sacrificial filler within the groove(s), disposing a coating over at least a portion of the outer surface of the substrate and over the sacrificial filler, and removing the sacrificial filler from the re-entrant shaped groove(s), such that the groove(s) and the coating together define one or more re-entrant shaped channels for cooling the component.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). In addition, the term "combination" is inclusive of blends, mixtures, alloys, reaction products, and the like.

Moreover, in this specification, the suffix "(s)" is usually intended to include both the singular and the plural of the term that it modifies, thereby including one or more of that term (e.g., "the passage hole" may include one or more passage holes, unless otherwise specified). Reference throughout the specification to "one embodiment," "another embodiment," "an embodiment," and so forth, means that a particular element (e.g., feature, structure, and/or characteristic) described in connection with the embodiment is included in at least one embodiment described herein, and may or may not be present in other embodiments. In addition, it is to be understood that the described inventive features may be combined in any suitable manner in the various embodiments.

Figure 1:
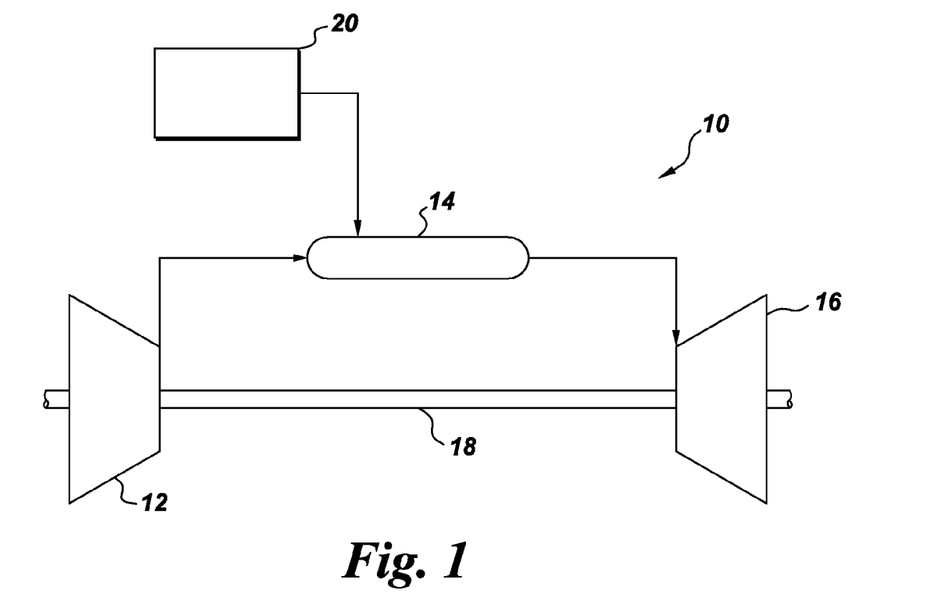
FIG. 1 is a schematic illustration of a gas turbine system.
Figure 2:
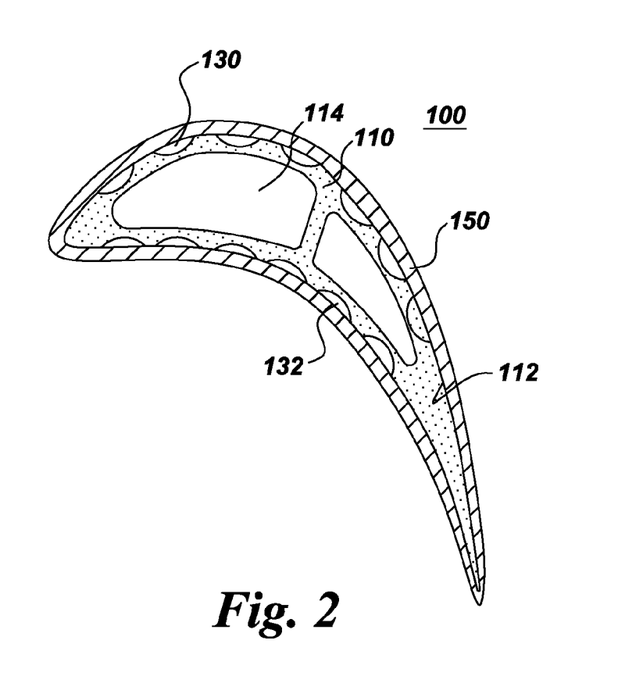
FIG. 2 is a schematic cross-section of an example airfoil configuration with cooling channels, in accordance with aspects of the present invention.

FIG. 1 is a schematic diagram of a gas turbine system 10. The system 10 may include one or more compressors 12, combustors 14, turbines 16, and fuel nozzles 20. The compressor 12 and turbine 16 may be coupled by one or more shaft 18. The shaft 18 may be a single shaft or multiple shaft segments coupled together to form shaft 18.

The gas turbine system 10 may include a number of hot gas path components 100. A hot gas path component is any component of the system 10 that is at least partially exposed to a high temperature flow of gas through the system 10. For example, bucket assemblies (also known as blades or blade assemblies), nozzle assemblies (also known as vanes or vane assemblies), shroud assemblies, transition pieces, retaining rings, and compressor exhaust components are all hot gas path components. However, it should be understood that the hot gas path component 100 of the present invention is not limited to the above examples, but may be any component that is at least partially exposed to a high temperature flow of gas. Further, it should be understood that the hot gas path component 100 of the present disclosure is not limited to components in gas turbine systems 10, but may be any piece of machinery or component thereof that may be exposed to high temperature flows.

When a hot gas path component 100 is exposed to a hot gas flow, the hot gas path component 100 is heated by the hot gas flow and may reach a temperature at which the hot gas path component 100 fails. Thus, in order to allow system 10 to operate with hot gas flow at a high temperature, increasing the efficiency and performance of the system 10, a cooling system for the hot gas path component 100 is required.

In general, the cooling system of the present disclosure includes a series of small channels, or micro-channels, formed in the surface of the hot gas path component 100. For industrial sized power generating turbine components, "small" or "micro" channel dimensions would encompass approximate depths and widths in the range of 0.25 mm to 1.5 mm, while for aviation sized turbine components channel dimensions would encompass approximate depths and widths in the range of 0.15 mm to 0.5 mm. The hot gas path component may be provided with a cover layer. A cooling fluid may be provided to the channels from a plenum, and the cooling fluid may flow through the channels, cooling the cover layer.

Figure 3:
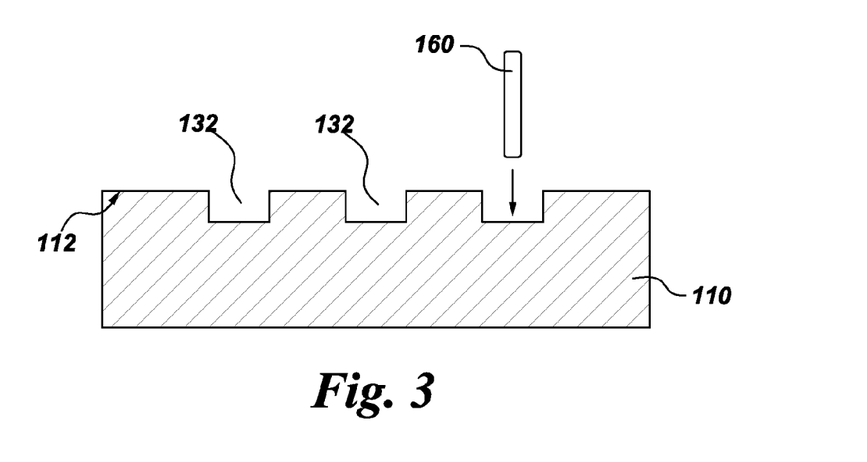
FIGS. 3-9 schematically illustrate process steps for applying a coating to a substrate using multiple fillers.
Figure 8:
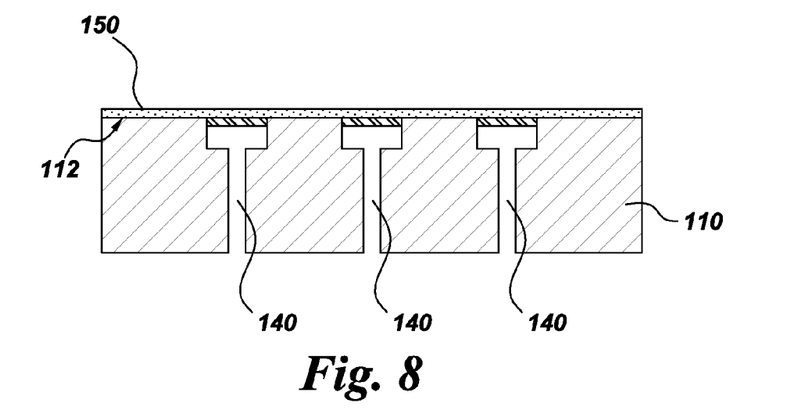
Figure 9:
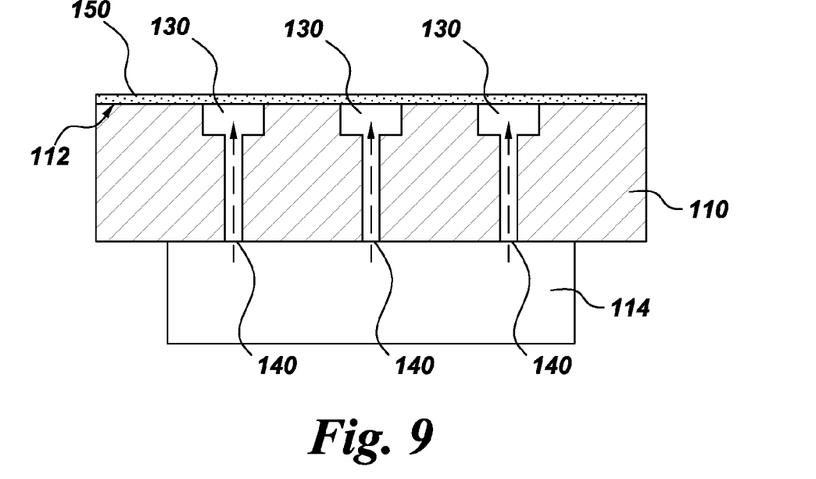
Figure 10:
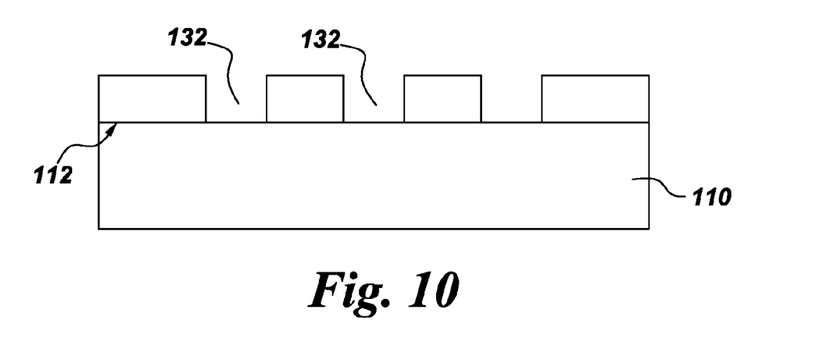
FIG. 10 illustrates another technique for forming grooves by adding material on the outer surface of the substrate on either side of the desired grooves.
Figure 13:
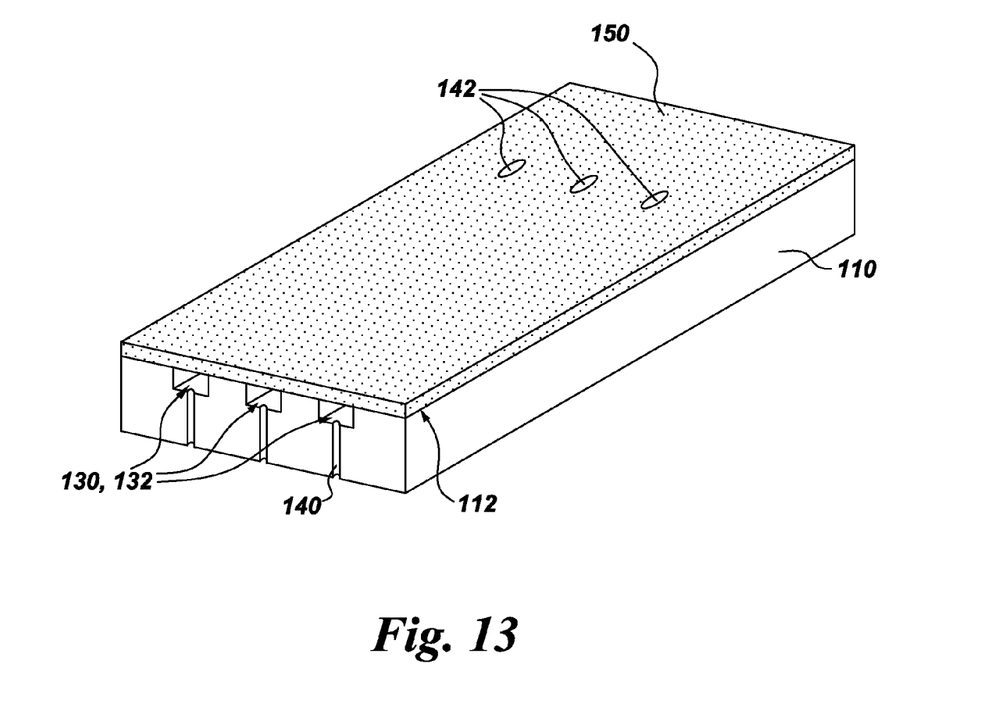
FIG. 13 schematically depicts, in perspective view, three example cooling channels that extend partially along the surface of the substrate and channel coolant to respective film cooling holes.
Figure 14:
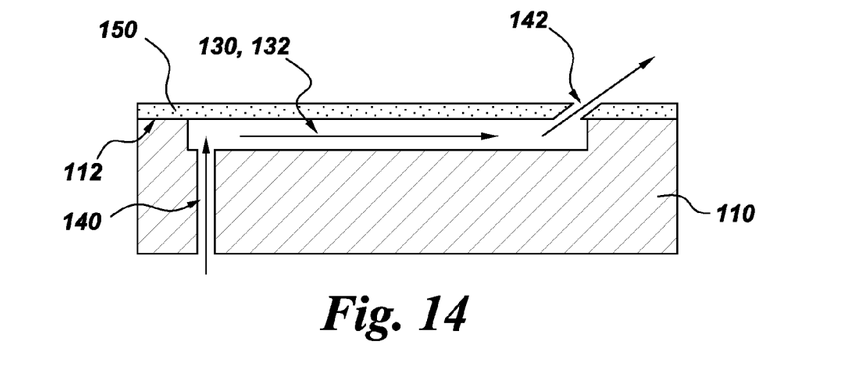
FIG. 14 is a cross-sectional view of one of the example cooling channels of FIG. 12 and shows the channel conveying coolant from an access hole to a film cooling hole.

A method of fabricating a component 100 is described with reference to FIGS. 2-11, 13 and 14. As indicated, for example in FIGS. 3 and 10, the component fabrication method includes forming one or more grooves 132 in a surface 112 of a substrate 110. As indicated in FIGS. 13 and 14, for example, each groove 132 has a base 134 and extends at least partially along the surface 112 of the substrate 110. The grooves 132 may be formed either by removing material from the substrate 110, as indicated in FIG. 3 or by adding material to the substrate 110 on either side of the desired grooves, as indicated in FIG. 10. U.S. Pat. No. 6,921,014, Hasz et al., "Method for forming a channel on the surface of a metal substrate," describes techniques for forming grooves by adding material to the substrate 110 and is incorporated by reference herein in its entirety. For the example arrangement shown in FIG. 2, the substrate 110 has at least one hollow interior space 114.

The substrate 110 is typically cast prior to forming grooves 132 in the outer surface 112 of the substrate 110. As discussed in commonly assigned U.S. Pat. No. 5,626,462, Melvin R. Jackson et al., "Double-Wall Airfoil," which is incorporated by reference herein in its entirety, substrate 110 may be formed from any suitable material. Depending on the intended application for component 100, this could include Ni-base, Co-base and Fe-base superalloys. The Ni-base superalloys may be those containing both γ and γ' phases, particularly those Ni-base superalloys containing both γ and γ' phases wherein the γ' phase occupies at least 40% by volume of the superalloy. Such alloys are known to be advantageous because of a combination of desirable properties including high temperature strength and high temperature creep resistance. The substrate material may also comprise a NiAl intermetallic alloy, as these alloys are also known to possess a combination of superior properties including high temperature strength and high temperature creep resistance that are advantageous for use in turbine engine applications used for aircraft. In the case of Nb-base alloys, coated Nb-base alloys having superior oxidation resistance will be preferred, particularly those alloys comprising Nb-(27-40)Ti-(4.5-10.5)Al-(4.5-7.9)Cr-(1.5-5.5)Hf-(0-6)V, where the composition ranges are in atom percent. The substrate material may also comprise a Nb-base alloy that contains at least one secondary phase, such as a Nb-containing intermetallic compound comprising a silicide, carbide or boride. Such alloys are composites of a ductile phase (i.e., the Nb-base alloy) and a strengthening phase (i.e., a Nb-containing intermetallic compound). For other arrangements, the substrate material comprises a molybdenum based alloy, such as alloys based on molybdenum (solid solution) with $Mo_5SiB_2$ and $Mo_3Si$ second phases. For other configurations, the substrate material comprises a ceramic matrix composite, such as a silicon carbide (SiC) matrix reinforced with SiC fibers. For other configurations the substrate material comprises a TiAl-based intermetallic compound.

Figure 5:
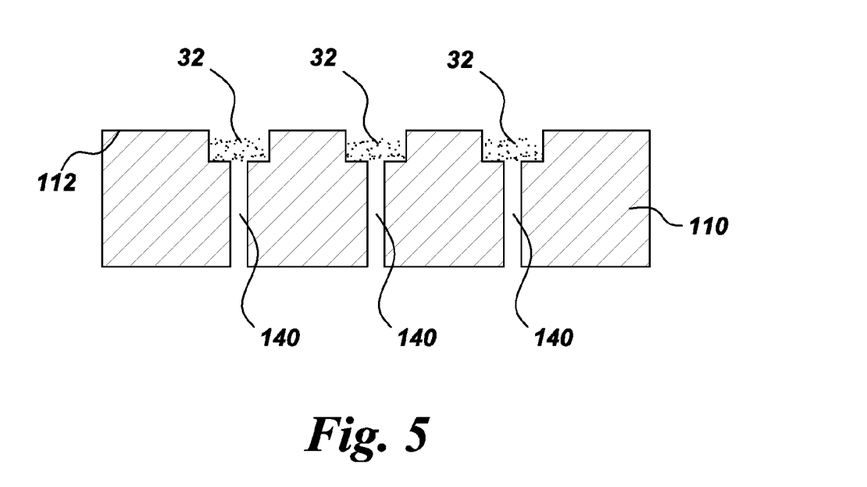
Figure 6:
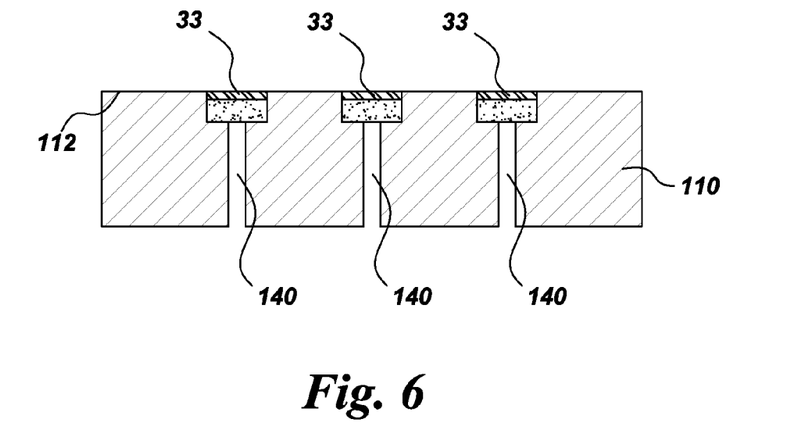
Figure 7:
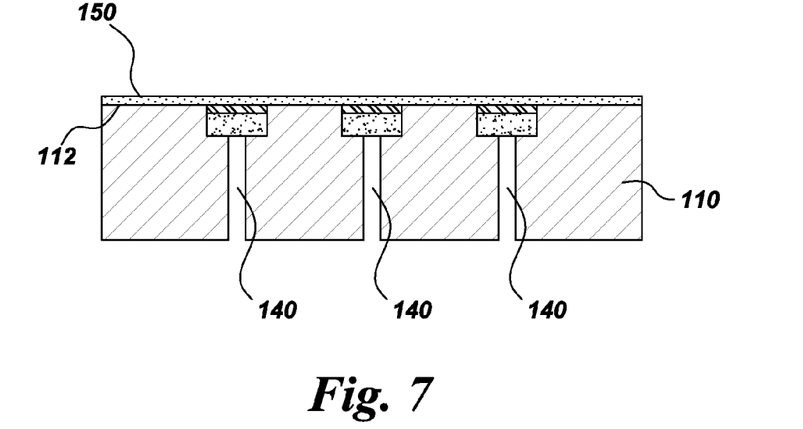

As indicated, for example, in FIGS. 5 and 6, the component fabrication method further includes depositing a sacrificial filler 32 within the groove(s) 132 and depositing a second filler 33 over the sacrificial filler 32. Suitable materials for fillers 32, 33 are provided below. It should be noted that although the interface between the first and second fillers is shown as being smooth in FIGS. 6 and 7, in practice this interface may be rough and/or may include voids. As indicated in FIGS. 7-9, for example, the component fabrication method further includes disposing a coating 150 over at least a portion of the surface 112 of the substrate 110 and over the second filler 33 and removing the sacrificial filler 32 and at least partially removing the second filler 33 from the groove(s) 132, such that the groove(s) 132 and the coating 150 (or a remaining portion of the second filler 33) together define one or more channels 130 for cooling the component 100. That is, for certain processes, the filler 33 may be completely removed, such that the grooves and the coating define the cooling channels. For other processes, a portion of the filler 33 may remain, such that the coating and the remaining portion of the filler 33, together with the grooves, define the cooling channels. For other processes, the remaining portion of the filler 33 and the grooves together define the cooling channels. Suitable materials for coating 150 are provided below. Although the grooves are shown as having straight walls, the grooves 132 can have any configuration, for example, they may be straight, curved, or have multiple curves.

It should be noted that although the figures show the second filler 33 as being completely removed, for certain processes, the removal of the second filler will be incomplete, such that a portion of the second filler remains after the removal process. For example, a portion of the second filler may adhere to or become part of the coating. For these processes, the remaining portion of the second filler may at least partially define the cooling channels 130 (together with the grooves 130).

As indicated in FIGS. 13 and 14, for example, the substrate 110 and the coating 150 may further define one or more exit film holes 142. For particular processes, the film holes 142 may be formed, for example by drilling, prior to removal of the fillers 32, 33. Beneficially, the fillers may act as backstops to the drilling of the holes. For the example configuration shown in FIGS. 13 and 14, the cooling channel 130 conveys coolant from the respective access hole 140 to the exiting film cooling hole 142. However, other configurations do not entail a film hole, with the cooling channels simply extending along the substrate surface 112 and exiting off an edge of the component, such as the trailing edge or the bucket tip, or an endwall edge. In addition, it should be noted that although the film holes are shown in FIG. 13 as being round, this is a non-limiting example. The film holes may also be non-circular shaped holes.

Coating 150 comprises a suitable material and is bonded to the airfoil-shaped outer surface 120 of substrate 110. For particular configurations, the coating 150 has a thickness in the range of 0.1-2.0 millimeters, and more particularly, in the range of 0.1 to 1 millimeter, and still more particularly 0.1 to 0.5 millimeters for industrial components. For aviation components, this range is typically 0.1 to 0.25 millimeters. However, other thicknesses may be utilized depending on the requirements for a particular component 100.

The coating 150 comprises structural coating layers and may further include optional additional coating layer(s). The coating layer(s) may be deposited using a variety of techniques. For particular processes, the structural coating layer(s) are deposited by performing an ion plasma deposition (cathodic arc). Example ion plasma deposition apparatus and method are provided in commonly assigned, US Published Patent Application No. 20080138529, Weaver et al, "Method and apparatus for cathodic arc ion plasma deposition," which is incorporated by reference herein in its entirety. Briefly, ion plasma deposition comprises placing a cathode formed of a coating material into a vacuum environment within a vacuum chamber, providing a substrate 110 within the vacuum environment, supplying a current to the cathode to form a cathodic arc upon a cathode surface resulting in arc-induced erosion of coating material from the cathode surface, and depositing the coating material from the cathode upon the substrate surface 112.

Non-limiting examples of a coating deposited using ion plasma deposition include structural coatings, as well as bond coatings and oxidation-resistant coatings, as discussed in greater detail below with reference to U.S. Pat. No. 5,626,462. For certain hot gas path components 100, the structural coating comprises a nickel-based or cobalt-based alloy, and more particularly comprises a superalloy or a (NiCo)CrAlY alloy. For example, where the substrate material is a Ni-base superalloy containing both γ and γ' phases, structural coating may comprise similar compositions of materials, as discussed in greater detail below with reference to U.S. Pat. No. 5,626,462.

For other process configurations, a structural coating is deposited by performing at least one of a thermal spray process and a cold spray process. For example, the thermal spray process may comprise combustion spraying or plasma spraying, the combustion spraying may comprise high velocity oxygen fuel spraying (HVOF) or high velocity air fuel spraying (HVAF), and the plasma spraying may comprise atmospheric (such as air or inert gas) plasma spray, or low pressure plasma spray (LPPS, which is also know as vacuum plasma spray or VPS). In one non-limiting example, a NiCrAlY coating is deposited by HVOF or HVAF. Other example techniques for depositing the structural coating include, without limitation, sputtering, electron beam physical vapor deposition, electroless plating, and electroplating.

For certain configurations, it is desirable to employ multiple deposition techniques for depositing structural and optional additional coating layers. For example, a first structural coating layer may be deposited using an ion plasma deposition, and a subsequently deposited layer and optional additional layers (not shown) may be deposited using other techniques, such as a combustion spray process or a plasma spray process. Depending on the materials used, the use of different deposition techniques for the coating layers may provide benefits in properties, such as, but not restricted to strain tolerance, strength, adhesion, and/or ductility.

The grooves 132 may be formed using a variety of techniques. For example, the grooves 132 may be formed using one or more of an abrasive liquid jet, plunge electrochemical machining (ECM), electric discharge machining with a spinning single point electrode (milling EDM), and laser machining (laser drilling). Example laser machining techniques are described in commonly assigned, U.S. patent application Ser. No. 12/697,005, "Process and system for forming shaped air holes" filed Jan. 29, 2010, which is incorporated by reference herein in its entirety. Example EDM techniques are described in commonly assigned U.S. patent application Ser. No. 12/790,675, "Articles which include chevron film cooling holes, and related processes," filed May 28, 2010, which is incorporated by reference herein in its entirety.

For particular process configurations, the grooves 132 are formed by directing an abrasive liquid jet 160 at the outer surface 112 of the substrate 110, as schematically depicted in FIG. 3. Example water jet drilling processes and systems are provided in U.S. patent application Ser. No. 12/790,675. As explained in U.S. patent application Ser. No. 12/790,675, the water jet process typically utilizes a high-velocity stream of abrasive particles (e.g., abrasive "grit"), suspended in a stream of high pressure water. The pressure of the water may vary considerably, but is often in the range of about 35-620 MPa. A number of abrasive materials can be used, such as garnet, aluminum oxide, silicon carbide, and glass beads.

In addition, and as explained in U.S. patent application Ser. No. 12/790,675, the water jet system can include a multi-axis computer numerically controlled (CNC) unit. The CNC systems themselves are known in the art, and described, for example, in U.S. Patent Publication 2005/0013926 (S. Rutkowski et al), which is incorporated herein by reference. CNC systems allow movement of the cutting tool along a number of X, Y, and Z axes, as well as rotational axes.

Figure 4:
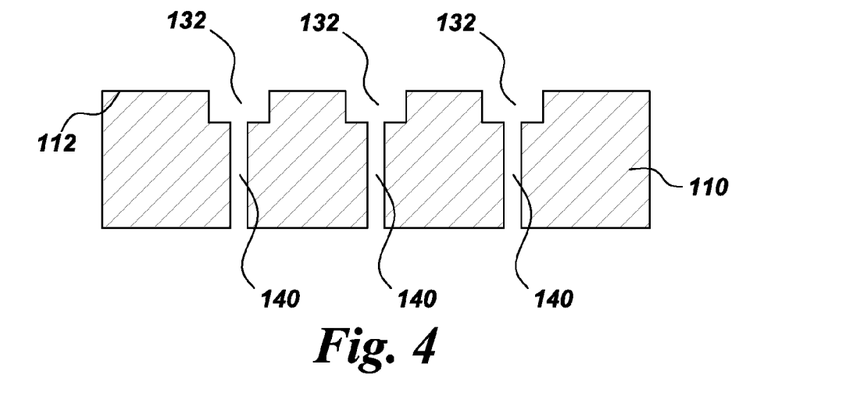
Figure 16:
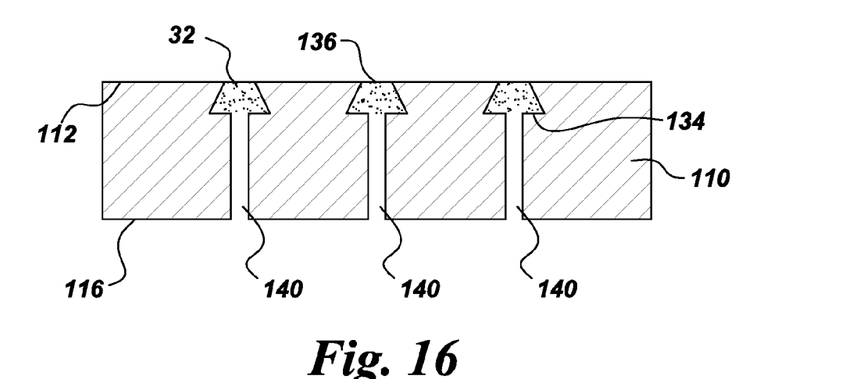

For the example process shown in FIG. 4, the component fabrication method further includes forming one or more access holes 140 through the base 134 of a respective one of the grooves 132 to provide fluid communication between the grooves 132 and the hollow interior space(s) 114. The access holes 140 are typically formed prior to depositing the sacrificial filler 32. However, for certain processes, the access holes may be formed after depositing the fillers, namely by drilling through the fillers as well as the substrate. The access holes 140 are typically circular or oval in cross-section and may be formed, for example using on or more of laser machining (laser drilling), abrasive liquid jet, electric discharge machining (EDM) and electron beam drilling. The access holes 140 may be normal to the base 134 of the respective grooves 132 (as shown in FIGS. 13, 16 and 19) or, more generally, may be drilled at angles in a range of 20-90 degrees relative to the base 134 of the groove. The access holes may be used to leach the fillers from the channels after the coating has been deposited.

For the process shown in FIGS. 7-9, the sacrificial filler 32 is removed from the groove(s) 132, and then the second filler 33 is removed from the groove(s) 132. Although not expressly shown, for certain process configurations, the second filler 33 may only be partially removed, such that a portion of the second filler remains. Depending on the application, a variety of materials may be used for the first and second fillers 32, 33. For particular arrangements, the sacrificial filler 32 comprises at least one material selected from the group consisting of wax, resin, metal, metal alloy, graphite and combinations thereof. Non-limiting examples of suitable resins, include epoxy and photo-curable resins (for example, visible or UV curable resins), non-limiting examples of which include a UV/visible light curable masking resin, marketed under the trademark Speedmask 729® by DYMAX, having a place of business in Torrington, Conn. If a resin is used, the method further includes the optional step of curing the resin 32 prior to depositing the second filler 33. Non-limiting example metal alloys include metal alloys with low melting temperatures (for example less than about 300° C.), such as solders, for example lead bismuth, tin lead, lead tin bismuth, and indium lead solders.

For more particular arrangements, the sacrificial filler 32 comprises wax or resin and further comprises an electrically conductive particulate phase, such as powders, flakes, and whiskers, dispersed within the wax or resin. By using an electrically conductive first filler 32, the second filler 33 may be deposited by electroplating. For example, the wax or resin base may be loaded with a graphite or aluminum powder, so that the second filler 33 can be electroplated over the sacrificial filler 32.

For particular configurations, the second filler 33 comprises at least one metal or metal alloy. The metal may be deposited using a metal ink, a solid metal filler, by electroplating or by electroless deposition. Non-limiting examples of deposition techniques for the metal layer 33 include using a syringe or direct write technique to deposit a metal ink, for example copper, molybdenum or tungsten ink particles dispersed in a resin binder. For other processes, a solid metal filler may be used, for example an annealed metal wire, as described in commonly assigned U.S. patent Ser. No. 12/953, 177, Ronald S. Bunker et al. "Turbine components with cooling features and methods of manufacturing the same." For other processes, a metal layer 33 may be deposited by electroplating or by electroless deposition. For example, a copper layer 33 may be deposited by electroplating, and molybdenum may be deposited by physical vapor deposition, for example by sputtering, evaporation, and ion plasma deposition.

A variety of techniques may be employed to remove the fillers 32, 33 depending on the specific filler materials used. For certain configurations, the second filler 33 may be removed from the groove(s) 132 by leaching. For example, if the second filler 33 comprises an electrolytically deposited copper layer, it may be removed using a 35% nitric acid solution. A molybdenum layer 33 may also be removed using a 35% nitric acid solution. If the second filler 33 comprises an aluminum wire layer, it may be removed using a 50% sodium hydroxide solution at ambient temperature. Chlorinated solvents may be used to remove metallic inks with resin binders.

For certain configurations, the sacrificial filler 32 may be readily removable, for example by melting, evaporating, pyrolizing, or oxidizing the sacrificial filler 32 out of the groove(s) 132. For example, a wax layer 32 may be removed by heating (for example, at about 100° C.) or by being burned out (vaporized) at about 300° C. In addition, where residue remains after performing an initial removal process, the residue may be removed by pyrolysis.

For more particular configurations, the sacrificial filler 32 comprises wax or resin, and the second filler 33 comprises at least one metal. The sacrificial filler 32 is removed by evaporation or burning the sacrificial filler 32 out of the groove(s) 132, and the second filler 33 is removed by leaching the second filler 33 out of the groove(s) 132. Beneficially, the sacrificial filler 32 can be removed relatively easily, and because the groove is only partially filed with the second filler 33, it can be removed (or partially removed) in less time, relative to a groove that is filled completely with the second filler 33.

For particular processes, the majority of the groove is filled with a readily removable first filler 32 and a relatively small amount of the second filler 33 is used. This facilitates the use of a second filler 33 that can withstand polishing (for example, grit blast) or other operations performed prior to coating, as well as withstanding the coating process itself. In addition, the removal process is improved because only a relatively small amount of the second filler 33 is used, with the majority of the filler comprising the more easily removed first filler 32. For particular configurations, the sacrificial filler 32 is deposited within the groove(s) 132 to a partial fill in a range of about 60-99.9% of the depth of the respective groove 132, and the second filler 33 is then deposited within the groove(s) 132 to at least a full fill of the respective groove 132. If the grooves are overfilled with the second material 33, the excess material may be removed, for example by application of a doctor blade or by polishing depending on the type of filler 33 used, prior to deposition of the coating 150.

Depending on the application, different materials may be used for the fillers 32, 33. For example, for other configurations, the sacrificial filler 32 comprises at least one metal. For example the sacrificial filler 32 is deposited using metal inks or solid metal fillers or by electroplating or electroless deposition. The second filler 33 may comprise at least one ceramic. In one non-limiting example, the ceramic filler is a mixture of fused silica and zircon with a binder. In another example, the sacrificial filler 32 comprises graphite ink, and the second filler 33 comprises electrolytically deposited copper. The first and/or second fillers 32, 33 may be removed by performing at least one leaching process. Example solutions for removing metals are disclosed above. Ceramic layers 33 may be removed, for example, using an aqueous solution of 20% sodium hydroxide at 200° C. for eight hours. For particular processes, the sacrificial filler 32 is removed by performing a first leaching process, and the second filler 33 is at least partially removed by performing a second leaching process.

Figure 11:
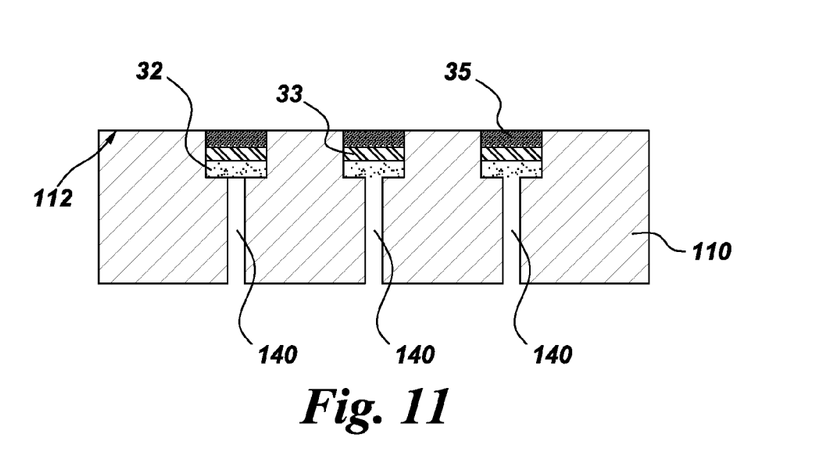
FIG. 11 schematically illustrates a process step using three fillers.

For the example arrangement shown in FIG. 11, the component fabrication method further includes depositing at least one additional filler 35 within the one or more grooves 132 after depositing the second filler 33. For particular processes, the sacrificial filler 32 comprises wax, the second filler 33 comprises graphite ink, and the additional filler 35 comprises electroplated metal copper. For this example, the sacrificial filler 32 may be removed by heating to a temperature of 100° C., the second filler 33 may be removed by heating at 500° C. (pyrolysis), and the additional filler 35 may be removed by leaching with 35% nitric acid. For other example processes, the first filler comprises wax or resin, the second filler comprises a metal or metal alloy, and the third filler comprises a ceramic.

In addition, the method may further optionally include the application of an oxidation coating, such as PtAl (for example for aviation components) or an MCrAlY coating, where M is selected from cobalt, nickel, or iron (for example, for stationary power generation components), to the interior surfaces of the cooling channels 130. For particular processes, the oxidation coating (not shown) may be applied after the fillers 32, 33, 35 have been removed and prior to performing an optional heat treatment.

Although, the process described above with reference to FIGS. 3-9 is shown as having rectangular grooves 132, the grooves may have a variety of shapes depending on the requirements of the specific application. For example, the grooves 132 (and channels 130) may be re-entrant grooves 132 (re-entrant channels 130), as described below with reference to FIG. 12. In addition, the side-walls of the grooves 132 (channels 130) need not be straight. For various applications, the side-walls of the grooves 132 (channels 130) may be curved or rounded.

Figure 12:
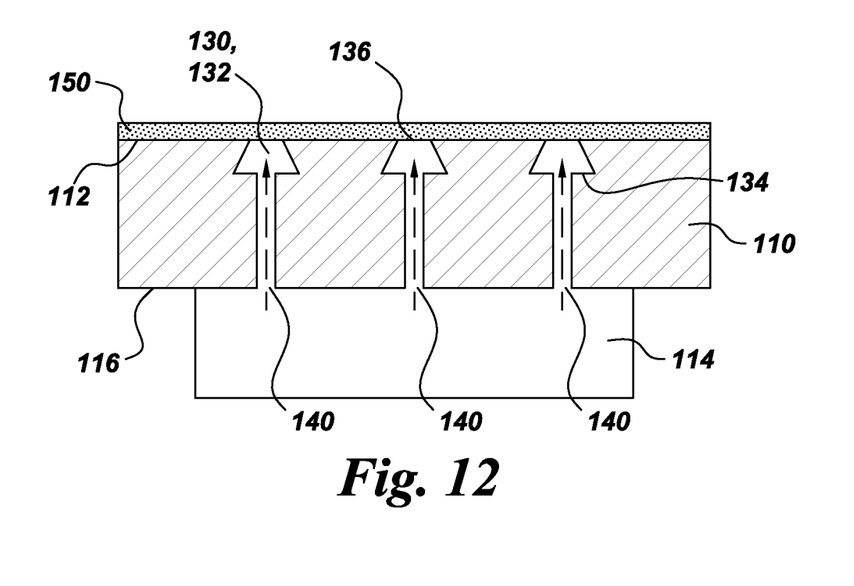
FIG. 12 schematically illustrates a coated component with re-entrant shaped cooling channels.

For the example configuration shown in FIG. 12, the base 134 of each respective groove 132 is wider than the top 136 thereof, such that each groove 132 comprises a re-entrant shaped groove 132. Re-entrant grooves 132 are discussed in commonly assigned, U.S. patent application Ser. No. 12/943,624, Bunker et al., "Components with re-entrant shaped cooling channels and methods of manufacture," which is incorporated by reference herein in its entirety. Beneficially, the use of re-entrant shaped grooves makes it easier to deposit the coating across the top of the groove, while also permitting the formation of sufficiently large channels 130 to meet the cooling requirements for the component 100. For particular configurations, the base 134 of a respective one of the re-entrant shaped grooves 132 is at least 2 times wider than the top 136 of the respective groove 132. For example, if the base 134 of the groove 132 is 0.75 millimeters, the top 136 would be less than 0.375 millimeters in width, for this configuration. For more particular configurations, the base 134 of the respective re-entrant shaped groove 132 is at least 3 times wider than the top 136 of the respective groove 132, and still more particularly, the base 134 of the respective re-entrant shaped groove 132 is in a range of about 3-4 times wider than the top 136 of the respective groove 132. Beneficially, a large base to top ratio increases the overall cooling volume for the microchannel 130, while making it easier to deposit a coating across the top of the groove.

As discussed in U.S. patent application Ser. No. 12/943,624, with reference to FIGS. 7 and 11 of U.S. Ser. No. 12/943,624, for certain configurations, the coating 150 completely bridges the respective grooves 132, such that the coating 150 seals the respective cooling channels 130. For other arrangements, the coating 150 defines one or more porous gaps (also termed "permeable slots"), for example, porosity in the coating 150 or a gap in the coating, such that the coating 150 does not completely bridge each of the respective grooves 132. Although the methods taught in U.S. patent application Ser. No. 12/943,624 deposit a coating without the use of fillers, re-entrant shaped grooves may also be advantageously coated using the multiple fillers of the process shown in FIGS. 3-9 of the present application. For example, the fillers may be used to make sure that the coating bridges the top of the groove, while simplifying the removal process for the more robust second filler 33 by virtue of using a relatively larger amount of the more readily removable sacrificial filler 32.

Figure 15:
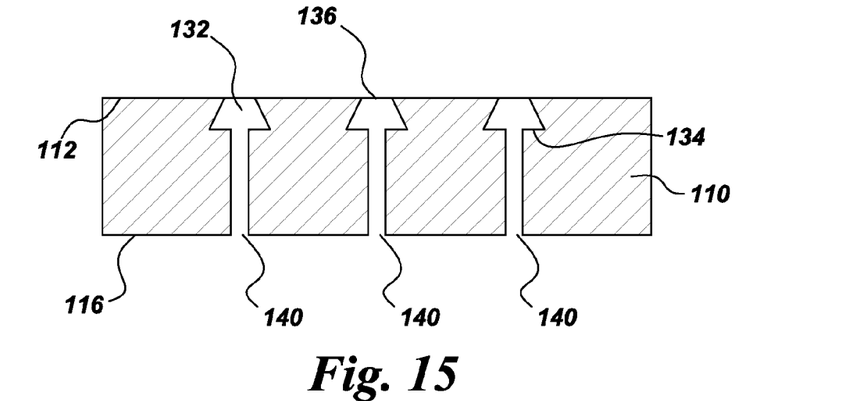
FIG. 15-17 schematically illustrate process steps for applying a coating to a substrate with re-entrant shaped grooves using a sacrificial filler.

Another component fabrication method is described with reference to FIGS. 3, 4, 10, 12, 13 and 15-17. As indicated in FIGS. 3 and 10, this method of fabricating a component 100 includes forming one or more grooves 132 in an outer surface 112 of a substrate 110. As noted above, the grooves 132 may be formed either by removing material from the substrate 110, as shown in FIG. 3, or by adding material to the substrate 110 on either side of the grooves, as indicated in FIG. 10. This step is described in more detail above with reference to FIGS. 3 and 10. As shown in FIG. 15, each groove 132 has a base 134 that is wider than the top 136 thereof and, as shown in FIG. 13, extends at least partially along the outer surface 112 of the substrate 110, such that each groove 132 comprises a re-entrant shaped groove 132.

Figure 17:
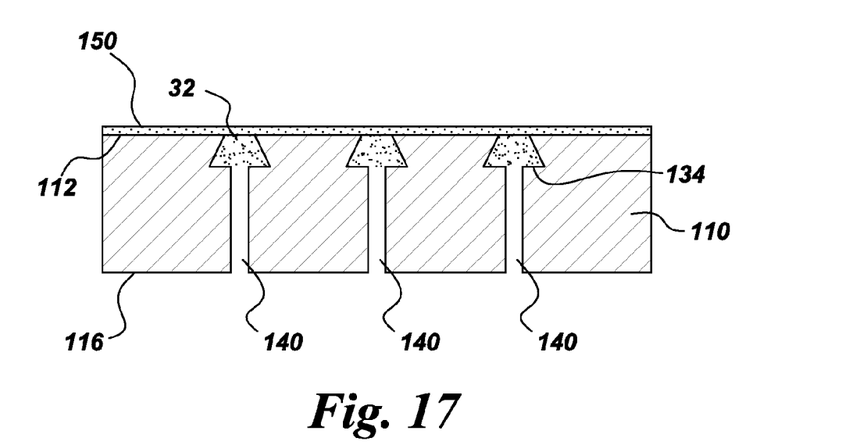

As indicated in FIGS. 16 and 17, this component fabrication method further includes depositing a sacrificial filler 32 within the one or more grooves 132 and disposing a coating 150 over at least a portion of the outer surface 112 of the substrate 110 and over the sacrificial filler 32. Example coating materials and deposition techniques are provided above. The component fabrication method further includes removing the sacrificial filler 32 from the groove(s) 132, such that the groove(s) 132 and the coating 150 together define one or more re-entrant shaped channels 130 for cooling the component 100. The resulting component 100 is shown in FIG. 12.

For particular processes, the sacrificial filler 32 comprises at least one material selected from the group consisting of wax, resin, metal alloy and combinations thereof. Non-limiting examples of suitable resins, include epoxy and photocurable resins (for example, visible or UV curable resins), non-limiting examples of which include a UV/visible light curable masking resin, marketed under the trademark Speedmask 729® by Dymax, having a place of business in Torrington, Conn. If a resin is used, the method further includes the optional step of curing the resin 32 prior to depositing the second filler 33. Non-limiting example metal alloys include metal alloys with low melting temperatures (for example less than about 300° C.), such as solders, for example lead bismuth, tin lead, lead tin bismuth and indium lead solders.

The removal technique will vary depending on the specific filler material used. For particular examples, the sacrificial filler 32 is removed by melting, evaporating, pyrolizing or oxidizing the sacrificial filler 32 out of the groove(s) 132. For example, a wax layer 32 may be removed by heating (for example, at about 100° C.) or by being burned out (vaporized) at about 300° C.) In addition, where residue remains after performing an initial removal process, the residue may be removed by pyrolysis.

As discussed above with reference to FIG. 4, the component fabrication method may further include forming one or more access holes 140 through the base 134 of a respective groove 132 to connect the respective groove 132 in fluid communication with the respective hollow interior space 114. As indicated in FIGS. 15 and 16, the access holes 140 are formed prior to depositing the filler 32. After the coating 150 has been deposited, the filler 32 may be removed from the channels 130 via the access holes 140.

Beneficially, the above-described methods provide improved means for depositing a coating over a grooved substrate to form a component with cooling channels. In particular, many of the above-described methods make it easier to provide a robust filler that can withstand the coating process, while providing for easier (and in some cases no) removal processes for the filler. In addition, certain of the above-described methods provide means for providing some support for a coating, with a readily removable filler. By simplifying (or eliminating) the removal process for the filler (s), these methods reduce the time and hence manufacturing costs for forming cooling channels within coated components.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of fabricating a component, the method comprising:
   forming one or more grooves in an outer surface of a substrate, wherein each of the one or more grooves has a base and a plurality of sidewalls and extends at least partially along the surface of the substrate;
   depositing a sacrificial filler within the one or more grooves;
   depositing a second filler on an uppermost surface of the sacrificial filler, wherein the second filler is comprised of a structural material and in contact with only the uppermost surface of the sacrificial filler and the plurality of sidewalls of the one or more grooves and wherein the second filler is not in contact with the base of each of the one or more grooves;
   disposing a coating over at least a portion of the outer surface of the substrate and over the second filler; and
   removing the sacrificial filler and removing a portion of the second filler from the one or more grooves, wherein at least a portion of the second filler remains within the one or more grooves, to define one or more channels for cooling the component.

2. The method of claim 1, wherein the one or more grooves are formed using one or more of an abrasive liquid jet, plunge electrochemical machining (ECM), electric discharge machining with a spinning electrode (milling EDM), and laser machining.

3. The method of claim 1, wherein the substrate has at least one hollow interior space, the method further comprising forming one or more access holes through the base of a respective one of the one or more grooves to connect the respective groove in fluid communication with the respective hollow interior space, wherein the access holes are formed prior to depositing the sacrificial filler.

4. The method of claim 1, wherein the sacrificial filler is removed from the one or more grooves and then the second filler is at least partially removed from the one or more grooves.

5. The method of claim 1, wherein the sacrificial filler comprises at least one material selected from the group consisting of wax, resin, metal, metal alloy, graphite, and combinations thereof.

6. The method of claim 5, wherein the sacrificial filler comprises wax or resin and further comprises an electrically conductive particulate phase dispersed within the wax or resin, and wherein the second filler is deposited by electroplating.

7. The method of claim 5, wherein the second filler comprises at least one metal or metal alloy.

8. The method of claim 1, wherein the sacrificial filler is removed by melting, evaporating, pyrolizing, or oxidizing the sacrificial filler out of the one or more grooves.

9. The method of claim 1, wherein the second filler is at least partially removed from the one or more grooves by leaching.

10. The method of claim 1, wherein the sacrificial filler comprises wax or resin, wherein the second filler comprises at least one metal, wherein the sacrificial filler is removed by evaporating, pyrolizing, or oxidizing the sacrificial filler out of the one or more grooves, and wherein the second filler is at least partially removed by leaching the second filler out of the one or more grooves.

11. The method of claim 1, wherein the sacrificial filler comprises at least one metal, and wherein the second filler comprises at least one ceramic.

12. The method of claim 11, wherein the sacrificial filler is removed and the second filler is removed by performing at least one leaching process.

13. The method of claim 11, wherein the sacrificial filler is removed by performing a first leaching process, and wherein the second filler is removed by performing a second leaching process.

14. The method of claim 1 further comprising depositing at least one additional filler within the one or more grooves after depositing the second filler.

15. The method of claim 1, wherein the sacrificial filler is deposited within the at least one or more grooves to a partial fill in a range of about 60-99.9 percent of the depth of the respective groove, and wherein the second filler is deposited within the at least one or more grooves to at least a full fill of the respective groove.

16. The method of claim 1, wherein each of the one or more grooves has a top, and wherein the base of the groove is wider than the top, such that each of the one or more grooves comprises a re-entrant shaped groove.

17. The method of claim 1, wherein the second filler comprises a second sacrificial filler and is completely removed from the one or more grooves after the coating has been disposed, such that the one or more grooves and the coating together define the one or more cooling channels.

18. The method of claim 1, wherein the second filler is only partially removed from the one or more grooves after the coating has been disposed.

19. A method of fabricating a component, the method comprising:
   forming one or more grooves in an outer surface of a substrate, wherein each of the one or more grooves has a base that is wider than a top thereof and a plurality of sidewalls and extends at least partially along the outer surface of the substrate, such that each of the one or more grooves comprises a re-entrant shaped groove;
   depositing a sacrificial filler within the one or more grooves;
   depositing a second filler on an uppermost surface of the sacrificial filler, wherein the second filler is comprised of a structural material and in contact with only the uppermost surface of the sacrificial filler and the plurality of sidewalls of the one or more re-entrant shaped grooves and wherein the second filler is not in contact with the base of each of the one or more re-entrant shaped grooves;
   disposing a coating over at least a portion of the outer surface of the substrate and over the second filler; and
   removing the sacrificial filler and removing a portion of the second filler from the one or more re-entrant shaped grooves, wherein at least a portion of the second filler remains within the one or more re-entrant shaped grooves, such that the one or more grooves including the portion of the second filler remaining in the one or more re-entrant shaped grooves and the coating together define one or more re-entrant shaped channels for cooling the component.

20. The method of claim 19, wherein the sacrificial filler comprises at least one material selected from the group consisting of wax, resin, metal alloy, graphite and combinations thereof.

21. The method of claim 19, wherein the sacrificial filler is removed by melting, evaporating, pyrolizing, or oxidizing the sacrificial filler out of the one or more grooves.

22. The method of claim 19, wherein the substrate has at least one hollow interior space, the method further comprising forming one or more access holes through the base of a respective one of the one or more grooves to connect the respective groove in fluid communication with the respective hollow interior space, wherein the access holes are formed prior to depositing the sacrificial filler.

* * * * *